United States Patent [19]
Konishi

[11] Patent Number: 4,604,731
[45] Date of Patent: Aug. 5, 1986

[54] OUTPUT CIRCUIT FOR A SEMICONDUCTOR MEMORY DEVICE
[75] Inventor: Satoshi Konishi, Tokyo, Japan
[73] Assignee: Shibaura Denki Kabushiki Kaisha, Japan
[21] Appl. No.: 528,790
[22] Filed: Sep. 2, 1983
[30] Foreign Application Priority Data
 Sep. 3, 1982 [JP] Japan ................. 57-153412
[51] Int. Cl.⁴ ............ G11C 7/00; H03K 19/092
[52] U.S. Cl. .................. 365/203; 365/189; 307/475; 307/452
[58] Field of Search ......... 365/190, 189, 203, 227; 307/448, 451, 452, 481, 473, 475

[56] References Cited
U.S. PATENT DOCUMENTS

| 3,896,430 | 7/1975 | Hatsukano | 307/473 |
| 3,942,160 | 3/1976 | Yu | 365/189 |
| 3,969,706 | 7/1976 | Proebsting et al. | 365/203 |
| 4,096,584 | 6/1978 | Owen, III et al. | 365/227 |
| 4,397,000 | 8/1983 | Nagami | 365/203 |
| 4,408,135 | 10/1983 | Yuyama et al. | 307/451 |
| 4,465,945 | 8/1984 | Yin | 307/473 |
| 4,491,749 | 1/1985 | Iwamura | 307/473 |

Primary Examiner—Terrell W. Fears
Assistant Examiner—Guy M. Miller
Attorney, Agent, or Firm—Finnegan, Henderson, Farabow, Garrett & Dunner

[57] ABSTRACT

An output circuit for a semiconductor memory device including a preset circuit connected to a data output terminal and adapted to set a potential on the data output terminal to a potential between a potential of a first potential supply terminal and a potential of a second supply terminal during a preparative period for read preceding a data readout from a memory cell whereby the potential level on the data output terminal reaches a "H" level or a "L" level. Thus, the output circuit with high speed readout operation and with high reliability by means of being free from the instability caused by an output noise can be obtained.

17 Claims, 9 Drawing Figures 4,604,731

OUTPUT CIRCUIT FOR A SEMICONDUCTOR MEMORY DEVICE

BACKGROUND OF THE INVENTION

This invention relates to an output circuit for a semiconductor memory device which can derive data from a memory cell at high speeds.

FIG. 1 shows an output circuit for a conventional semiconductor memory device. A P-channel type MOS transistor 11 and N-channel type MOS transistor 12 are connected in series between a power source terminal $V_{DD}$ and a power source terminal (ground) $V_{SS}$. These MOS transistors are controlled by the output signals of a control circuit 13. The control circuit 13 comprises two inverter circuits 14 and 15 constituting a latch circuit for holding a data signal D which is transferred from a memory cell. Circuit 13 also comprises a NOR gate 16 having one terminal supplied with an output of the inverter 14 and the other terminal supplied with a control signal $\phi1$, a NAND gate 18 having one terminal supplied with the output of the inverter 14 and the other terminal supplied with the control signal $\phi1$ through an inverter 17, and inverters 19 and 20 for inverting the outputs of the NOR and NAND gates 16 and 18. The MOS transistor 11 is controlled by the output of the inverter 19 and the MOS transistor 12 is controlled by the output of the inverter 20. An output signal Dout is output through a junction between the MOS transistors 11 and 12.

The operation of the above-mentioned circuit arrangement will be explained below:

The circuit arrangement receives a high ("H") level signal as a control signal $\phi1$ when data is written into the memory cell. The outputs of the inverters 19 and 20 become "H" and "L" (low) levels, respectively, and in this manner the MOS transistors 11 and 12 are turned OFF. As a result, the output terminal reaches a high impedance state. The circuit arrangement receives the "L" level signal as the control signal $\phi1$ when data is read out of the memory cell. When the data signal D, which is input to the latch circuit from the memory cell, reaches a "H" level, the MOS transistor 11 is turned ON and the MOS transistor 12 is turned OFF. An output signal Dout becomes a "H" level signal. When the data signal D is at a "L" level, the MOS transistor 11 is turned OFF and the MOS transistor 12 is turned ON. The output signal Dout becomes a "L" level signal. It should be noted that the output signal Dout is maintained so long as the data signal is being read out by the next address. At the same time the output state remains unchanged. That is, the output signal Dout remains constant until latch data held in the latch circuit varies.

Since, however, the output signal Dout varies between the $V_{SS}$ level and the $V_{DD}$ level, a relatively long time is required for the output signal to be set, and high speed operation is difficult to be attained. As the output signal Dout suffers a full swing from the $V_{DD}$ level to the $V_{SS}$ level, or vice versa, larger charging or discharging currents flow into the memory device so as to drive a load which is connected to the output terminal of the output circuit. As a result, large internal noises are generated on the internal power source line of the memory device, which causes the operational errors of the memory device.

SUMMARY OF THE INVENTION

It is accordingly the object of this invention to provide a high reliable output circuit for a semiconductor device which can realize high-speed operation and can reduce an operational error.

According to this invention there is provided an output circuit for a semiconductor memory device, comprising first and second potential supply terminals, a data signal input terminal for receiving a data signal read out of a memory cell, a control signal input terminal for receiving a control signal, a signal output terminal, a first transistor connected between the first potential supply terminal and the signal output terminal, a second transistor connected between the second potential supply terminal and the signal output terminal, a presetting circuit comprised of a third transistor connected between the signal output terminal and the first potential supply terminal and a fourth transistor connected between the signal output terminal and the second potential supply circuit, a control circuit for controlling the first and second transistors according to a data signal input from the data signal input terminal and control signal input to the control signal input terminal, and means for controlling the preset circuit, during a read preparative state for read preceding the data readout from a memory cell, to set a potential on the signal output terminal to a potential between a potential on the first potential supply terminal and that on the second potential supply terminal.

DETAILED DESCRIPTION OF THE PREFERRED EMBODIMENTS

Figure 2:
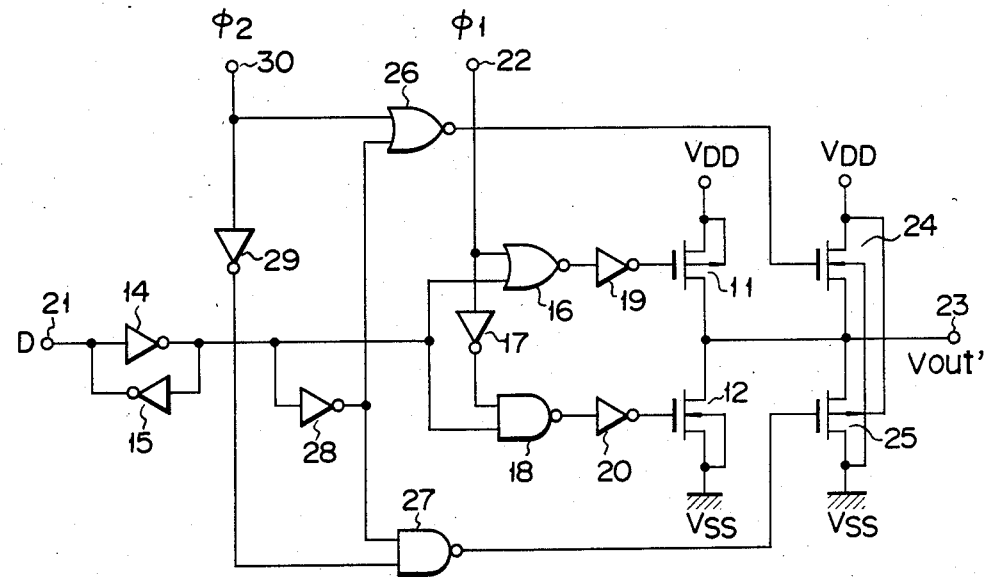
FIG. 2 is a circuit diagram showing an output circuit for a semiconductor memory device, according to one embodiment of this invention.

FIG. 2 is a circuit diagram for a semiconductor memory device according to one embodiment of this invention. An inverter 14 has its input terminal connected to a data signal input terminal 21 and an inverter 15 has its input and output connected to the output and input of the inverter 14, these inverters constituting a latch circuit. A NOR gate 16 and NAND gate 18 have their first input connected to the output of the inverter 14. A control signal input terminal 22 for receiving a control signal $\phi1$ is connected to a second terminal of the NOR gate 16 and the output of the NOR gate 16 is connected to the input of an inverter 19. An inverter 17 is connected between a second terminal of the NAND gate 18 and the control signal input terminal 22, and the input of an inverter 20 is connected to the output of the NAND gate 18. A first transistor of a P-channel type (one conductivity type) has its gate connected to the output of the inverter 19.

The MOS transistor 11 is connected between a power source terminal $V_{DD}$ (a first potential supply terminal) and an output terminal 23 and has its back gate connected to the power source terminal $V_{DD}$. A second transistor 12 of an N-channel type (the other conductivity type as opposed to the P-channel type) has its gate connected to the output of the inverter 20 and is connected between the power supply terminal (a second power supply terminal) $V_{SS}$ and the output terminal 23. The back gate of the transistor 12 is connected to the power source terminal $V_{SS}$. A third MOS transistor 24 of an N-channel type is connected between the output terminal 23 and the power source terminal $V_{DD}$ and a fourth MOS transistor of a P-channel type is connected between the output terminal 23 and the power source terminal $V_{SS}$. The back gate of the MOS transistor 24 is connected to the power source terminal $V_{SS}$ and the back gate of the transistor 25 is connected to the power source terminal $V_{DD}$.

The transistors 24 and 25 constitute a preset circuit for presetting the output terminal 23 to a potential between the $V_{SS}$ level and the $V_{DD}$ level. The preset circuit is controlled by a preset circuit control means comprised of a NOR gate 26, NAND gate 27 and inverters 28 and 29. The output of the NOR gate 26 is connected to the gate of the MOS transistor 24, and a control signal input terminal 30 supplied with a control signal $\phi 2$ is connected to a first input terminal of the NOR gate 26. The output of the inverter 28 is connected to a second input terminal of the NOR gate 26. The output of the NAND gate 27 is connected to the gate of the MOS transistor 25. The output of the inverter 28 is connected to one terminal of the NAND gate 27 and an inverter 29 is connected between the control signal input terminal 30 and a second input signal of the NAND gate 27. The output of the inverter 14 is connected to the input of the inverter 28.

It is desirable for the attainment of a high-speed operation to preset the potential of the signal output terminal 23 at an intermediate level between the $V_{DD}$ level and the $V_{SS}$ level preceding to the normal read operation. Even if the exactly intermediate potential level is not realized, a high-speed operation can still be obtained by properly determining the conductances of the MOS transistors 11, 12 and 24, 25. If, for example, the conductance of the MOS transistor 11 is greater than that of the MOS transistor 12, the rising-transition speed of the output signal on the output terminal 23 is more rapid than the falling-transition speed. Where the preset potential on the output terminal 23 is lower than the intermediate potential level between the $V_{DD}$ level and the $V_{SS}$ level, the time required for an output signal to rise can be substantially equal to the time required for it to fall, making the circuit as a whole high in operation speed.

For this operation, it is necessary that the preset potential level be lower than the intermediate potential level. In order to attain this, the conductance of the MOS transistor 25 needs to be made greater than that of the MOS transistor 24. If, on the other hand, the conductance of the MOS transistor 11 is smaller than that of the MOS transistor 12, the inverse relation results. The above-mentioned conductance relations means that, if the conductance ratio of the MOS transistor 11 to the transistor 25 is equal to that of the MOS transistors 12 to the transistor 24, a high-speed operation can be realized. In this connection it should be noted that, since the conductance of the MOS transistor depends upon a potential difference in a drain-to-source path thereof, a maximum conductance value is given as the definition of the transistor conductance mentioned above where the drain-source potential difference is substantially zero.

The operation of the circuit arrangement of FIG. 2 will be explained below.

When data is written into a memory cell in a write mode, the control signals $\phi 1$, $\phi 2$ are both at the "H" level and the MOS transistors 11, 12, 24 and 25 are all turned OFF. As a result, the output terminal 23 is placed at a high impedance level. In a read mode, the control signal $\phi 1$ is kept at the "H" level for the preparative period proceeding to data readout, and the transistors 11 and 12 are turned OFF irrespective of the bit line data of a previous cycle which is stored in the latch circuit. During this time period the control signal $\phi 2$ is set at a "L" level and the NOR gate 26 and NAND gate 27 are enabled by the bit line data of the previous cycle which is stored in the latch circuit, causing the MOS transistors 11 and 12 to be rendered conductive and thus an output level being set. With the bit line voltage data (data signal) D of the previous cycle is at a "H" level, for example, the MOS transistor 11 has been rendered ON and the MOS transistor 12 has been rendered OFF. Thus, an output Vout has been reached a "H" level.

During the preparative period for readout in the next cycle, the control signal $\phi 1$ reaches a "H" level and the MOS transistors 11 and 12 are both rendered to be nonconductive. Since at this time the control signal $\phi 2$ reaches a "L" level, one (i.e. the MOS transistor 25 in this case) of the MOS transistors 24 and 25, which has been in the OFF state, is rendered ON and the MOS transistor 24 is maintained at the OFF state. Thus, the "H" level potential on the output terminal 23, which is the data output in the previous cycle, is discharged through the MOS transistor 25 and, when the preparative period for read is nearly completed, the potential level on the output terminal reaches an intermediate level between the $V_{DD}$ level and the $V_{SS}$ level.

When data is read out of the next memory cell and the data signal D varies, the control signal $\phi 2$ reaches the "H" level and the MOS transistor 25 which has been in the ON state is turned OFF as in the case of the transistor 24. Then, the control signal $\phi 1$ reaches the "L" level and accordingly the output signal Vout' varies from such an intermediate level to the "H" ($V_{DD}$) level or an "L" ($V_{SS}$) level according to the new data signal D.

Since, as mentioned above, the output signal Vout' varies from the intermediate level (i.e. a level intermediate between the $V_{DD}$ level and the $V_{SS}$ level) to the $V_{DD}$ level or the $V_{SS}$ level, a high-speed output setting is assured. Also since the output signal Vout' does not fully swing at a stroke between the $V_{DD}$ level and the $V_{SS}$ level, it is possible to reduce internal noises in the memory device generated by charging and discharging currents for driving an external load connected to the output terminal 23, resulting to preventing operational errors.

In the circuit arrangement mentioned, the respective MOS transistors 24 and 25 serve as a pentode. Suppose the intermediate potential level is 2 to 3 V when $V_{DD}$ is 5 V. Then, the intermediate potential output at the end of preset period is held within the range of 2 to 3 V even if the output load varies in a five-fold range. In other words, this output circuit has wide output load tolerance, as much as five-fold. In a conventional triode operation, however, the output load in a range of less than double has the same tolerance. The larger the absolute threshold value of the pentode type transistors, the broader the allowable capacity range of the external load. If, for example, the absolute values of the threshold voltages of the transistors 24, 25 are set to be about 1.5 V, the allowable capacity range of output load is as much as ten times as great.

The relation of operation sequence in the device with respect to the control signals $\phi1$, $\phi2$ will now be explained below.

Figure 3:
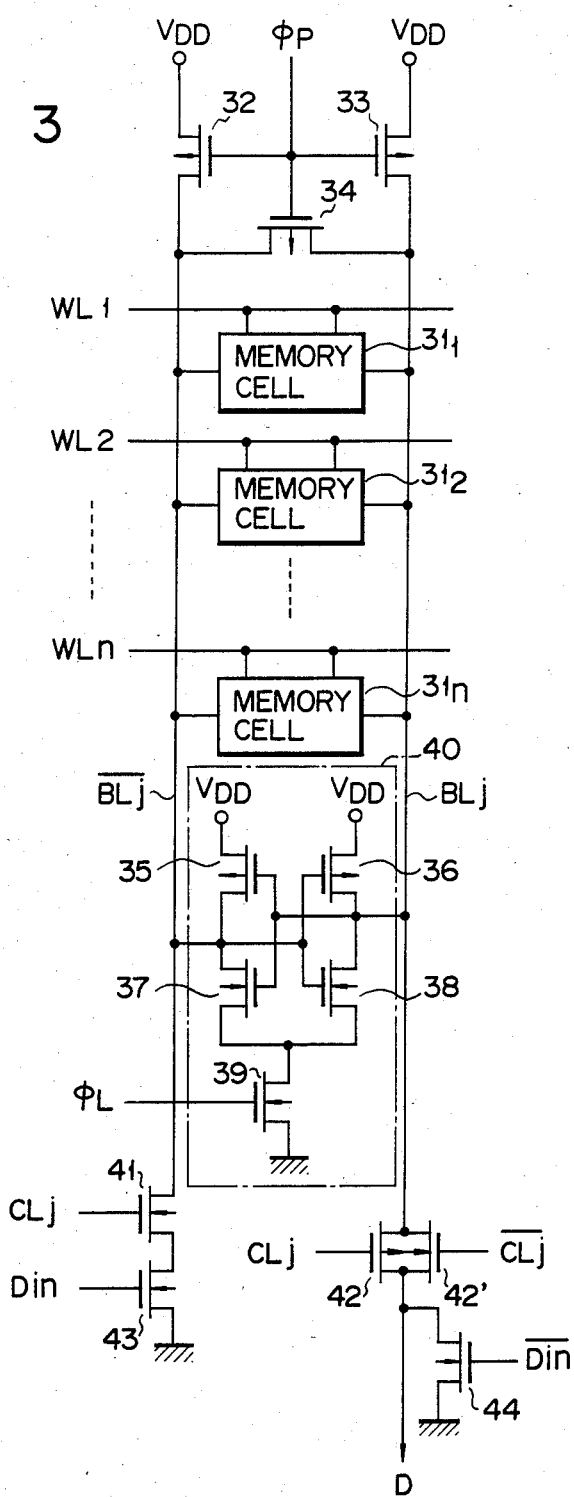
FIG. 3 is a circuit diagram of the semiconductor memory device which is to be connected the output circuit in FIG. 2.

FIG. 3 shows a plurality of static type memory cells $31_1$, $31_2$, ..., $31_n$ connected to bit lines BLj and $\overline{BLj}$. In FIG. 3, MOS transistors 32, 33 and 34 are precharging transistors to the bit lines BLj and $\overline{BLj}$ and are controlled by a precharge signal $\phi P$. WL1, WL2, ..., WLn are word lines adapted to select the memory cells in the rows of a memory cell array. MOS transistors 35 to 39 constitute a sense circuit 40 controlled by a latch signal $\phi L$ supplied to the gate of the MOS transistor 39. When a level on one of the bit lines BLj or $\overline{BLj}$ is lower than that on the other line according to the storage data of a selected memory cell, a level difference is amplified and latched by the same circuit 40. The MOS transistors 41, 42, 42' act as switches for selecting the bit lines in the column direction of the memory cell array and are rendered conductive by the respective column select signals CLj and CLj, $\overline{CLj}$. MOS transistors 43, 44 are transistors for writing data into the selected memory and are controlled by input data signals Din, $\overline{Din}$. The potential on the bit line BLj is supplied, as a data signal D from the selected memory cell, to the latch circuit (FIG. 2) of the output circuit.

The operation of the circuit of FIG. 3 will be explained below by referring to the timing chart of FIG. 4.

Figure 1:
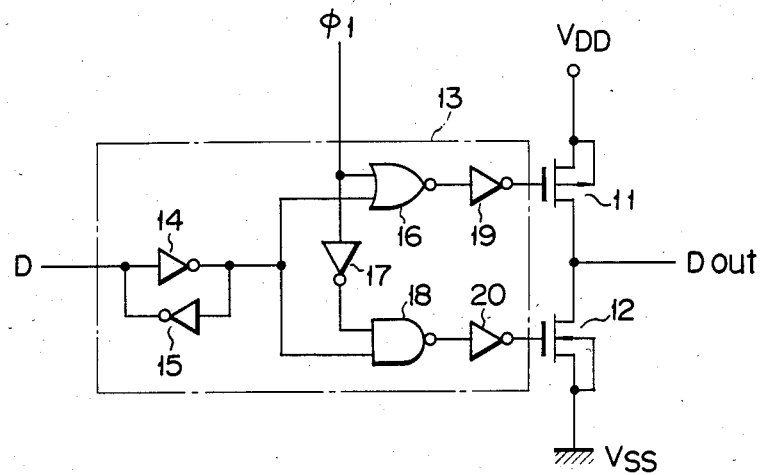
FIG. 1 is a circuit diagram showing an output circuit of a conventional semiconductor memory device.

When at time t0 a precharge signal $\phi P$ for the bit line drops due to a variation of the control signal which is generated according to a variation of a chip enable signal or an address input signal, the MOS transistors 32, 33 and 34 are turned ON and a pair of bit lines BLj, $\overline{BLj}$ begin to be charged to the power source level $V_{DD}$. At time t1 when a potential (in this case, a $V_{SS}$ level) on one of the bit lines BLj, $\overline{BLj}$ is increased to some extent so that no interference occurs between the memory cells connected to the same pair of bit lines, a potential on a selected word line WLi is increased. At time t2, the precharge signal $\phi P$ is increased, completing a precharging operation. A small potential difference is made between the bit lines BLj and $\overline{BLj}$ by data stored in the memory cell $31_i$ (i=any of numbers 1 to n) which is selected by the word line WLi. A latch signal $\phi L$, which goes low at substantially the same time as the start of the precharging operation (i.e. time t0'), is increased at time t3, amplifying the potential difference between the bit lines BLj and BLj and setting the potential on one bit line BLj to the $V_{SS}$ level and the potential on the other bit line $\overline{BLj}$ to the $V_{DD}$ level. These levels are latched. At time t4, a column select signal CLj is set to a "H" level and a column select signal CLj to a "L" level. At time t5, a potential on the bit line BLj is output as the data signal D. This data is input to the output circuit of FIG. 1 and finally output as an output signal Dout.

Figure 4:
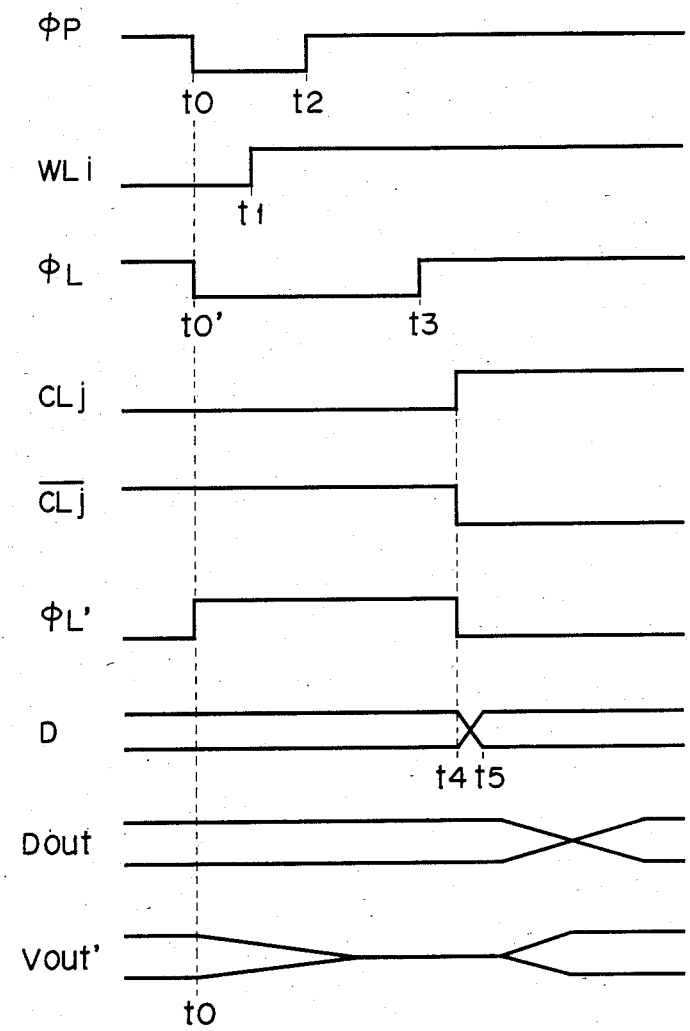
FIG. 4 is timing chart explaining the operation of the circuit shown in FIGS. 2 and 3.

In this connection it is to be noted that, for convenience of explanation, FIG. 4 shows both cases where the output signal Dout varies from the "L" level to the "H" level and from the "H" level to the "L" level. In the output circuit as shown in FIG. 2, a potential on the signal output terminal 23 is set to a predetermined level between the $V_{DD}$ level and the $V_{SS}$ level during an internal operation time from the time t0 at which the bit line starts to be precharged to the time t5 at which the storage data signal D is output. The control signals $\phi1$, $\phi2$ may be set to $\phi1=\overline{\phi P}$ and $\phi2=\phi P$; $\phi1=\overline{\phi L}$ and $\phi2=\phi L$; or $\phi1=\phi L'$ and $\phi2=\overline{\phi L'}$. The rising of signal $\phi L'$ coincides with the falling of signal $\phi P$ or $\phi L$ and the signal $\phi L'$ falls to the "L" level upon lapse of a predetermined period of time after the signal $\phi L$ rises. Thus, the output signal Vout' in the circuit shown FIG. 2 varies toward an intermediate level between the $V_{DD}$ level and the $V_{SS}$ level soon after the bit line begins to be precharged. When the output circuit (FIG. 2) receives, as a data signal D, data which is read out of the memory cell, the output signal Vout' immediately changes to the $V_{DD}$ level or the $V_{SS}$ level according to the level of the data signal D.

In a data write mode, the MOS transistors 11, 12 and 24, 25 are all turned OFF and the control signals $\phi1$, $\phi2$ are at the $V_{DD}$ level.

These internal control signals are originally generated by the selection signal to the device given at the external device pin as for synchronous memory devices, and by output signal from an address transition detector circuit which senses and detects the change of external address signal as for asynchronous memory ones.

Figure 5:
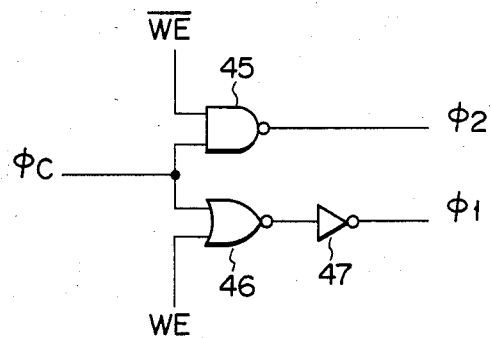
FIG. 5 is one form of a circuit for supplying a control signal to the circuit of FIG. 2.

FIG. 5 shows a control signal generator circuit for generating the control signals $\phi1$, $\phi2$. The control signal generator circuit comprises a NAND gate 45 with a first input supplied with an inverted replica $\overline{WE}$ of a write enable signal WE and a second input supplied with a control signal $\phi C$, a NOR gate 46 having a first input supplied with a control signal $\phi C$ and a second input supplied with the write enable signal WE, and an inverter 47 for inverting an output of the NOR gate 46. In write mode, these gates are set to WE=$V_{DD}$ and $\overline{WE}=V_{SS}$. As a result, both control signals $\phi1$ and $\phi2$ are set to the "H" ($V_{DD}$) level and the MOS transistors 11, 12 and 24, 25 connected to the output terminal 23 (FIG. 2) are all turned OFF, causing the output terminal 23 to reach the high impedance state. In read mode, Din=$\overline{Din}=V_{SS}$ and the MOS transistors 43, 44 are rendered OFF with the result that no data is written in the selected memory cell. In write mode, since one of the input data signals Din, $\overline{Din}$ reaches $V_{DD}$ level, the potential of one of the bit lines BLj, $\overline{BLj}$ goes down to $V_{SS}$ level and the potential of the other bit line up to $V_{DD}$ level by means of a latch type sensor circuit 40. Data is written into the memory cell connected to the selected word line WLi. The control signal $\phi C$ shown in FIG. 5 is set with respect to each choice of the signals $\phi1$ and $\phi2$ as follows: at $\phi1=\overline{\phi P}$ and $\phi2=\phi P$, $\phi C=\overline{\phi P}$; at $\phi1=\overline{\phi L}$ and $\phi2=\phi L$, $\phi C=\phi L$; and at $\phi1=\phi L'=\phi2=\overline{\phi L'}$, $\phi C=\phi L'$.

To inspect the above, the following test was conducted with two synchronizing type 16K bit static RAMs; one including the output circuit of this invention and one including a conventional output circuit. The access time of these RAMs were measured as follows. The RAM including the conventional output circuit required an access time of the order of 100 ns, of which about 25 ns was required to drive an externally connected load capacity. The RAM including the output circuit of this invention required an access time of 80 to 90 ns, of which about 15 ns was required to drive the external load for the signal relation $\phi 1 = \overline{\phi P}$ and $\phi 2 = \phi P$. For $\phi 1 = \overline{\phi L}$ and $\phi 2 = \phi L$ or $\phi 1 = \overline{\phi L'}$ and $\phi 2 = \phi L'$, about 5 ns was required to drive the external load. Even for $\phi 1 = \overline{\phi P}$ and $\phi 2 = \phi P$, about 5 ns was required to drive the external load by setting the channel width of the MOS transistors 24, 25 of FIG. 2 to be greater. The noise on power source line generated from the device per se is also reduced. Upon measurement of a bit error precentage on a common circuit board on which the RAM having the conventional output circuit and that having the output circuit of this invention are mounted it was found that the error could be reduced to about one-tenth that of the conventional device.

Figure 6:
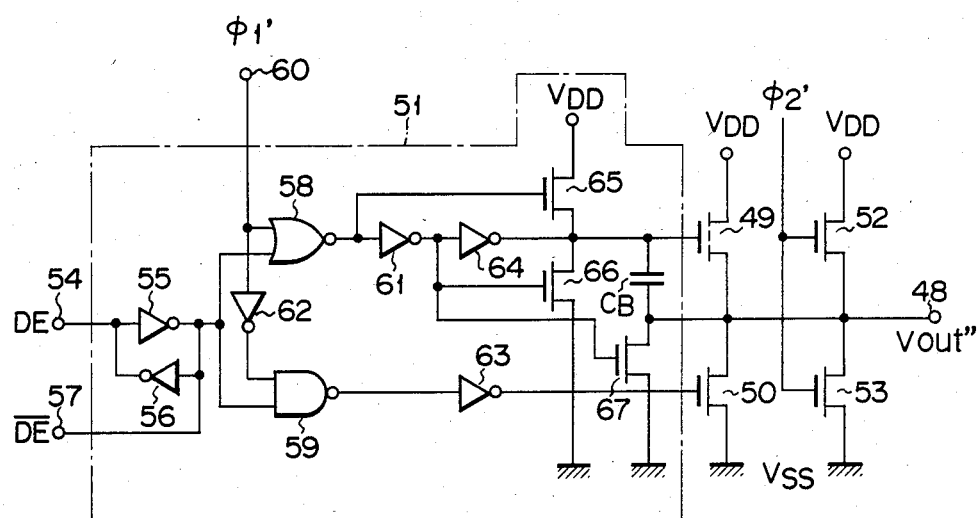
FIG. 6 is a circuit diagram showing an output device for a semiconductor memory device according to another embodiment of this invention.

FIG. 6 shows an E/D type output circuit according to another embodiment of this invention which is comprised of enhancement type and depletion type MOS transistors and which is based on the circuit of FIG. 2. A first, intrinsic type MOS transistor 49 having a threshold voltage of substantially zero volts is connected between a power source terminal $V_{DD}$ and an output terminal 48. A second, enhancement type, MOS transistor 50 is connected between a power source terminal $V_{SS}$ and the output terminal 48. The transistors 49, 50 are controlled by a control circuit 51. A third, enhancement type MOS transistor 52 is connected between the power source terminal $V_{DD}$ and the output terminal 48 and a fourth, enhancement type MOS transistor 53 is connected between the power source terminal $V_{SS}$ and the output terminal 48. The MOS transistors 52, 53 are controlled by a control signal $\phi 2'$. The control circuit 51 receives data signals DE, $\overline{DE}$ read out of the memory cell and control signal $\phi 1'$. An input of an inverter 55 and output of an inverter 56 are connected to a data signal input terminal 54 to which the data signal $\overline{DE}$ is supplied. The output of the inverter 55 and input of the inverter 56 are connected to a data signal input terminal 57 to which the data signal DE is supplied. The inverters 55 and 56 constitute a latch circuit.

First input terminals of a NOR gate 58 and NAND gate 59 are connected to the output of the inverter 55. A control signal input terminal 60 to which the control signal $\phi 1'$ is supplied is connected to a second input terminal of the NOR gate 58. The output of the NOR gate 58 is connected to the input of an inverter 61. An inverter 62 is connected between a second input terminal of the NAND gate 59 and a control signal input terminal 60. The output of the NAND gate 59 is connected to the input of an inverter 63. The input of an inverter 64 is connected to the output of the inverter 61 and the gate of the MOS transistor 49 is connected to the output of the inverter 64. An enhancement type MOS transistor 65 is connected between the output of the inverter 64 and the power source terminal $V_{DD}$. The output of the NOR gate 58 is connected to the gate of the MOS transistor 65. An enhancement type MOS transistor 66 is connected between the output of the inverter 64 and the power source terminal $V_{SS}$. The output of the inverter 61 is connected to the gate of the MOS transistor 66. A bootstrap capacity CB is connected between the gate of the MOS transistor 49 and the output terminal 48. The enhancement type MOS transistor 67 is connected between the output terminal 48 and the power source terminal $V_{SS}$. The output of the inverter 61 is connected to the gate of the transistor 67.

Figure 7:
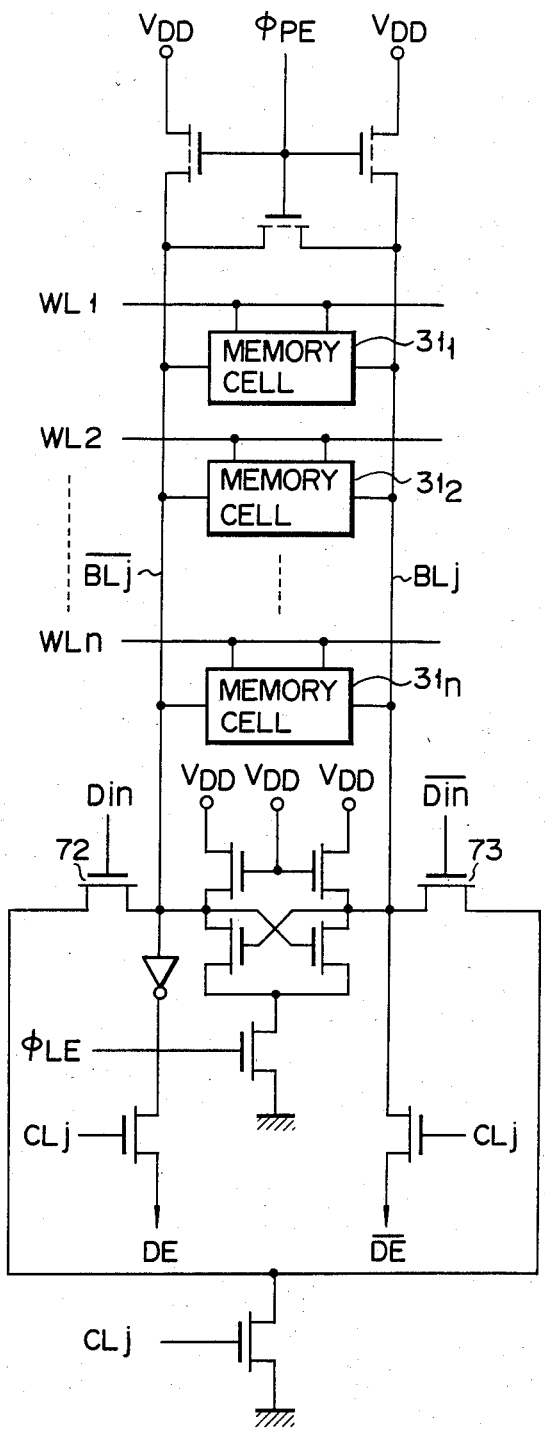
FIG. 7 is a circuit diagram of the semiconductor memory device which is to be connected the output circuit in FIG. 6.
Figure 8:
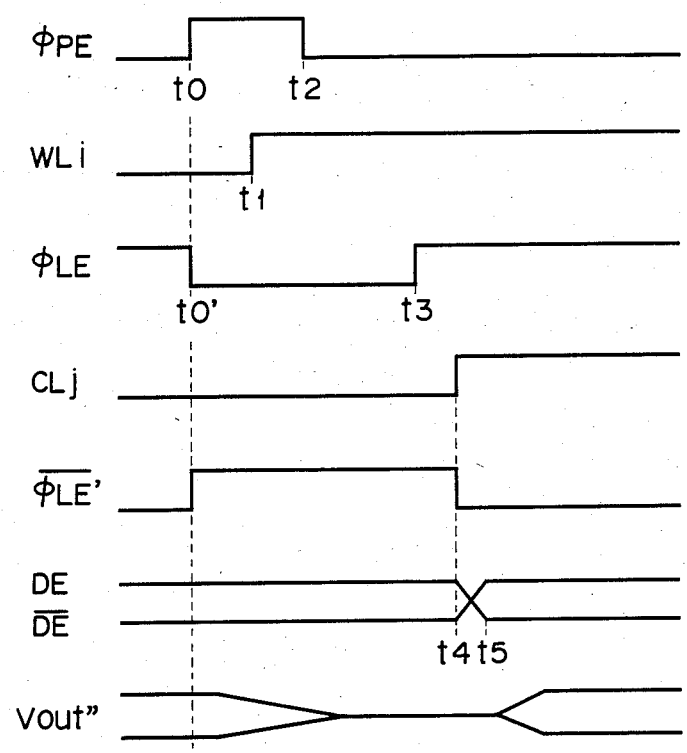
FIG. 8 is timing chart explaining the operation of the circuit shown in FIGS. 6 and 7.

The operation of the above-mentiond circuit arrangement will be explained by referring to FIG. 7 to FIG. 9. For the case, for example, where an inverted replica $\overline{\phi LE'}$ of the latch signal whose rising portion is delayed in comparison with the original latch signal is used as the control signal ($\phi 1'$, $\phi 2'$), the signal which has the relation $\phi E = \overline{\phi LE'}$ is used in the control signal generator of FIG. 9. With a start of a precharging time a latch signal $\phi LE$ reaches a "L" level. When the latch is released, the signal $\overline{\phi LE'}$ reaches a "H" level and the MOS transistors 49, 50 are turned OFF. At this time, the transistors 52, 53 constituting a ratio circuit are turned ON, causing the output signal Vout″ to vary from the $V_{DD}$ level or the $V_{SS}$ level to a level between the $V_{DD}$ level and the $V_{SS}$ level and thus causing the level to reach a predetermined level. When a potential on the bit line is transferred as a data signal (DE, $\overline{DE}$) to the control circuit after the latch signal $\phi LE$ has reached the "H" level, the signal $\overline{\phi LE'}$ reaches the "L" level and the MOS transistors 52, 53 are both turned OFF. When the data signal DE reaches a "H" or a "L" level, one of the MOS transistor 49 or 50 is turned ON and thus the output signal Vout″ reaches a $V_{DD}$ or a $V_{SS}$ level.

In a write mode, the transistors 49, 50, 52 and 53 connected to the output terminals 48 are all turned OFF. Where, the signals $\phi 1'$ and $\phi 2'$ reach the "H" and "L" levels, respectively.

Figure 9:
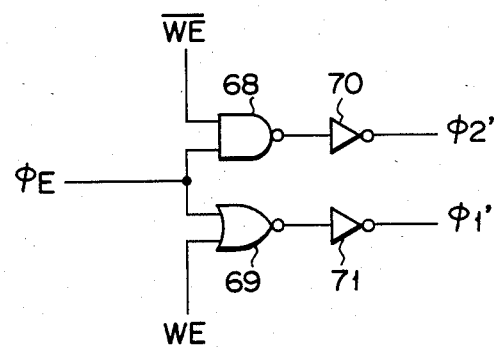
FIG. 9 is one form of a circuit for supplying a control signal to the circuit of FIG. 6.

FIG. 9 shows a control signal generator circuit for generating the control signals $\phi 1'$, $\phi 2'$. The control signal generator circuit comprises a NAND gate 68 and has its first input supplied with an inverted replica WE of a write enable signal WE and its second input supplied with a control signal $\phi E$, a NOR gate 69 having its first input supplied with the control signal $\phi E$ and its second input supplied with the write enable signal WE, an inverter 70 for inverting an output of the NAND gate 68 and an inverter 71 for inverting an output of the NOR gate 69.

In the write mode, the signals WE and $\overline{WE}$ are at the "H" and "L" levels, respectively, and control signals $\phi 1'$ and $\phi 2'$ are at the "H" and "L" levels, respectively. Thus, the MOS transistors 49, 50, 52 and 53 connected to the output terminal 48 are all turned OFF and the output terminal 48 reaches a high impedance state. In the read mode, the input data signals Din, $\overline{Din}$ are both at the "L" levels and the enhancement type MOS transistors 72, 73 (FIG. 7) are rendered OFF, with the result that no data signal is written on the bit line (BLj, $\overline{BLj}$). In the write mode, one of the input data signals Din, $\overline{Din}$ is at the $V_{DD}$ level, one of the bit lines $\overline{BLj}$ and BLj is at the $V_{SS}$ level and the other bit line at a near-$V_{DD}$ level with the result that data is written into a selected memory cell. Not only the inverted signal $\phi LE'$ but also the bit line precharge signal $\phi PE$ and the inverted replica $\overline{\phi LE}$ of the latch signal may be used as the control signal $\phi E$ for the control signal ($\phi 1'$, $\phi 2'$). The same effects as mentioned above, such as high speed operation and low noise generation, can also be obtained in the E/D circuit arrangement.

It is desirable in the attainment of a high-speed operation to set the presetting potential on the output terminal 48 to an intermediate level between the $V_{SS}$ level and the $V_{DD}$ level. It is therefore necessary that the ON resistance of the MOS transistor 52 be made equal to that of the MOS transistor 53. Even where, as in the above-mentioned embodiment, the presetting potential is not an intermediate potential between the $V_{SS}$ level and the $V_{DD}$ level, a high-speed operation can also be realized if the ratio between the maximum conductance values of the MOS transistors 49 and 53 is substantially equal to that between the maximum conductance values of the MOS transistors 50 and 52.

What is claimed is:

1. An output circuit for a semiconductor memory device, comprising:
   first and second potential supply terminals;
   a data signal input terminal for receiving a data signal read out of a memory cell;
   a control signal input terminal for receiving a control signal;
   a signal output terminal;
   a first transistor connected between the first potential supply terminal and the signal output terminal;
   a second transistor connected between the second potential supply terminal and the signal output terminal;
   a preset circuit including of a third transistor connected between the signal output terminal and the first potential supply terminal and a fourth transistor connected between the signal output terminal and the second potential supply terminal;
   a control circuit for controlling the first and second transistors according to the data signal input to the data signal input terminal and the control signal input to the control signal input terminal; and
   preset circuit control means for presetting the third and fourth transistors during a preparative period for read preceding the data readout from the memory cell, to set a potential on the signal output terminal to a potential between a potential of the first potential supply source and that of the second potential supply source.

2. An output circuit of claim 1, wherein said preparative period for read preceding the data readout includes a bit line precharge period.

3. An output circuit of claim 1, wherein said control circuit comprises a latch circuit for latching said data signal, a NOR gate connected to receive an output of the latch circuit and said control signal, a NAND gate connected to receive an output of the latch circuit and an inverted replica of said control signal, a first inverter connected to invert the output of the NOR gate and control the first transistor, and a second inverter connected to invert the output of the NAND gate and control the second transistor.

4. An output circuit of claim 3, wherein said first transistor is a MOS transistor of a first conductivity type and said second transistor is a MOS transistor of a second conductivity type.

5. An output circuit of claim 3, wherein said control signal is produced through a NOR gate and an inverter for inverting an output of said NOR gate, said NOR gate having a first input terminal connected to receive a bit line precharging control signal and a second input terminal connected to receive a write command signal.

6. An output circuit of claim 1, wherein said preset circuit control means comprises an inverter for inverting the data signal, a NOR gate connected to receive an output of said inverter and a control signal and to control the third transistor by an output thereof, and a NAND gate connected to receive an output of said inverter and an inverted replica of said control signal and to control the fourth transistor.

7. An output circuit of claim 6, wherein said third transistor is of a second conductivity type and said fourth transistor is of a first conductivity type.

8. An output circuit of claim 6, wherein said control signal is generated by a NAND gate having a first input terminal connected to receive a signal based on a bit line control signal and a second input terminal connected to receive said inverted replica of said write command signal.

9. An output circuit of claim 1, wherein a ratio of maximum conductance value of said first transistor to that of said fourth transistor is substantially equal to a ratio of maximum conductance value of said second transistor to that of said third transistor.

10. An output circuit of claim 1, wherein the potential on said signal output terminal which is set by said preset circuit is an intermediate potential between the potential of said first potential supply terminal and the potential of said second potential supply terminal.

11. An output circuit of claim 1, wherein said control circuit and preset circuit control means are controlled by a control signal which is based on a signal generated by detecting a transistion of an address signal.

12. An output circuit of claim 1, wherein said control circuit comprises a latch circuit for latching said data signal, a NOR gate connected to receive an output of the latch circuit and a control signal, a NAND gate connected to receive the output of said latch circuit and an inverted replica of said control signal, first and second inverters connected to provide an output of said NOR gate to said first transistor therethrough, and a third inverter connected to invert an output of said NAND gate and control said second transistor.

13. An output circuit of claim 12, wherein said first transistor includes an intrinsic type MOS transistor and said second transistor includes an enhancement type MOS transistor.

14. An output circuit of claim 12, wherein said control signal is produced through a NOR gate and an inverter for inverting an output of said NOR gate, said NOR gate having a first input terminal connected to receive a signal based on a bit line control signal and a second input terminal connected to receive a write command signal.

15. An output circuit of claim 1, wherein said preset circuit control means comprises a NAND gate having a first input terminal connected to receive a signal based on a bit line control signal and a second input terminal connected to receive an inverted replica of a write command signal, and an inverter connected to invert an output of the NAND gate and control said third and fourth transistors.

16. An output circuit of claim 15, wherein said third and fourth transistors includes enhancement type MOS transistors.

17. An output circuit of claim 15, wherein said third and fourth transistors are formed such that their conduction resistances are substantially equal to each other when they are both turned ON.

* * * * *

UNITED STATES PATENT AND TRADEMARK OFFICE
CERTIFICATE OF CORRECTION

PATENT NO. : 4,604,731
DATED : August 5, 1986
INVENTOR(S) : Konishi, Satoshi

It is certified that error appears in the above-identified patent and that said Letters Patent is hereby corrected as shown below:

On the Title Page:

Assignee should read "Tokyo Shibaura Denki Kabushiki Kaisha, Kawasaki, Japan"

Signed and Sealed this

Tenth Day of March, 1987

*Attest:*

DONALD J. QUIGG

*Attesting Officer*    *Commissioner of Patents and Trademarks*